United States Patent
Thean et al.

(10) Patent No.: US 8,039,341 B2
(45) Date of Patent: Oct. 18, 2011

(54) SELECTIVE UNIAXIAL STRESS MODIFICATION FOR USE WITH STRAINED SILICON ON INSULATOR INTEGRATED CIRCUIT

(75) Inventors: Voon-Yew Thean, Austin, TX (US); Bich-Yen Nguyen, Austin, TX (US); Da Zhang, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 652 days.

(21) Appl. No.: 11/428,953

(22) Filed: Jul. 6, 2006

(65) Prior Publication Data

US 2008/0014688 A1    Jan. 17, 2008

(51) Int. Cl.
*H01L 21/8238* (2006.01)
(52) U.S. Cl. ... 438/231; 438/300; 438/301; 257/E21.43; 257/E21.431
(58) Field of Classification Search ............ 438/231, 438/300, 301, 197; 257/194, E21.001, E21.43, 257/E21.431
See application file for complete search history.

(56) References Cited

U.S. PATENT DOCUMENTS

| | | | |
|---|---|---|---|
| 6,391,695 B1 * | 5/2002 | Yu | 438/166 |
| 7,429,775 B1 * | 9/2008 | Nayak et al. | 257/369 |
| 2003/0068502 A1 * | 4/2003 | Togashi et al. | 428/446 |
| 2004/0053481 A1 * | 3/2004 | Chakravarthi et al. | 438/514 |
| 2005/0035369 A1 * | 2/2005 | Lin et al. | 257/194 |
| 2005/0230732 A1 * | 10/2005 | Park et al. | 257/296 |
| 2006/0113590 A1 * | 6/2006 | Kim et al. | 257/330 |
| 2006/0237801 A1 * | 10/2006 | Kavalieros et al. | 257/388 |

OTHER PUBLICATIONS

M. Yoshimi et al., "Strained-SOI(sSOI) Technology for High Performace CMOSFET in 45-nm-or-below Technology Node", SSTIC, 2006.

* cited by examiner

*Primary Examiner* — Walter L Lindsay, Jr.
*Assistant Examiner* — Abdulfattah Mustapha

(57) ABSTRACT

A semiconductor fabrication process includes masking a first region, e.g., an NMOS region, of a semiconductor wafer, e.g., a biaxial, tensile strained silicon on insulator (SOI) wafer and creating recesses in source/drain regions of a second wafer region, e.g., a PMOS region. The wafer is then annealed in an ambient that promotes migration of silicon. The source/drain recesses are filled with source/drain structures, e.g., by epitaxial growth. The anneal ambient may include a hydrogen bearing species, e.g., $H_2$ or $GeH_2$, maintained at a temperature in the range of approximately 800 to 1000° C. The second region may be silicon and the source/drain structures may be silicon germanium. Creating the recesses may include creating shallow recesses with a first etch process, performing an amorphizing implant to create an amorphous layer, performing an inert ambient anneal to recrystallize the amorphous layer, and deepening the shallow recesses with a second etch process.

8 Claims, 4 Drawing Sheets

SELECTIVE UNIAXIAL STRESS MODIFICATION FOR USE WITH STRAINED SILICON ON INSULATOR INTEGRATED CIRCUIT

FIELD OF THE INVENTION

The invention is in the field of semiconductor fabrication and integrated circuits and, more specifically, fabrication processes and integrated circuits that employ strained silicon.

RELATED ART

In the field of integrated circuits, strained silicon refers generally to the practice of intentionally stressing the channels of NMOS and/or PMOS transistors to improve carrier mobility. Biaxially-strained substrates including, but no limited to, Strained-Si on SiGe, Strained-SiGe on Insulator, and Strained-Si directly on Insulator, provide high levels of stress directly in the channel of the devices fabricated on these substrates. In contrast, typical process-induced stressors introduce stress remotely through the addition of stressed materials adjacent or in close proximity to the channel in order to induce a strained channel. However, simultaneously improving the carrier mobility for both types of devices is difficult with a uniformly-strained substrate because PMOS carrier mobility and NMOS carrier mobility are optimized under different types of stress. Moreover, stress conditions that optimize carrier mobility may negatively impact other device characteristics such as threshold voltage, thereby complicating the selection of stress conditions. It would be desirable to implement a fabrication process and design for devices fabricated on biaxially-strained substrate in which NMOS and PMOS carrier mobility is simultaneously optimized without negatively affecting other device characteristics.

BRIEF DESCRIPTION OF THE DRAWINGS

The present invention is illustrated by way of example and not limited by the accompanying figures, in which like references indicate similar elements, and in which.

Figure 1:
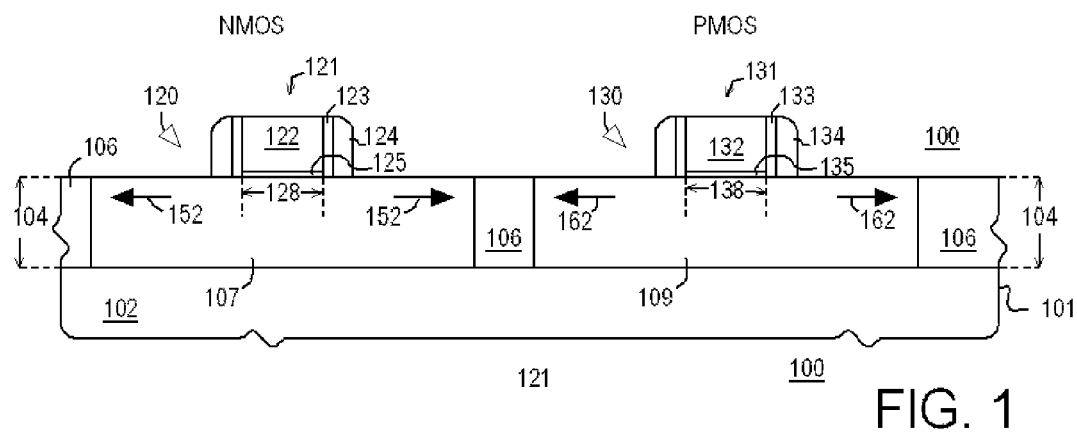
FIG. 1 is a partial cross sectional view of an integrated circuit emphasizing symmetry between NMOS and PMOS devices of like ratio (W/L)

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one aspect, an integrated circuit semiconductor fabrication process includes altering the inherent or existing stress conditions in a semiconductor wafer, e.g., a semiconductor on insulator (SOI) wafer to produce an integrated circuit having stress conditions that are favorable for both NMOS and PMOS transistors. Altering the stress conditions includes the use of an amorphizing implant to create an amorphous region in a source/drain recess of intermediate depth and an anneal process that promotes silicon migration in a source/drain recess of a final depth, prior to epitaxial deposition of the source/drain material. The amorphizing implant and the silicon migration reduce a stress component oriented along a channel axis in the second region of the wafer.

In one embodiment, a disclosed semiconductor fabrication process includes masking a first region, e.g., an NMOS region, of a wafer, creating a first recess in source/drain regions of a second region, e.g., a PMOS region, of the wafer, accompanied by a shallow, angled amorphizing implant and a short duration thermal anneal followed by the creation of a second and deeper recess. A second anneal of the wafer is then performed using an ambient that promotes migration of silicon. The first recess increases the free-surface for stress relaxation and facilitates the reach of the angled amorphizing implant to reduce the stress in channel. The silicon migration that occurs during the second anneal further reduces stress along a channel axis in the second region. The source/drain recesses are then refilled with source/drain structures. In some embodiments, the source/drain structures are silicon germanium or another material that produces compressive stress in a transistor channel of the second region.

In some embodiments, masking the first region includes depositing a thin pad oxide layer and thereafter depositing a relatively thick silicon nitride layer. In embodiments where the first region is an NMOS region, the silicon nitride layer is preferably stress neutral or compressive. The first recess in the source/drain may vary in depth between approximately 15 to 25 nm to accommodate a shallow angled amorphizing implant using a heavy atom implant species, e.g., Ge, Xe, and Si and an energy between approximately 10 to 30 keV and a dose in a range of approximately $1\times10^{14}$ to $1\times10^{16}$ cm$^{-2}$. The relatively short firm anneal to recrystallize amorphous silicon may be a laser or flash lamp anneal. This is followed by further recessing of the shallow recesses to form deeper, second recesses and a second anneal in an active ambient.

Annealing the wafer may include exposing the wafer to a hydrogen bearing ambient maintained at a temperature in a range of approximately 800 to 1000° C. at low pressure. The annealing ambient may include $H_2$, $GeH_2$, or another suitable source of hydrogen. Refilling the source/drain recesses may include using an epitaxy process to grow the source/drain structures. The source/drain structures may be silicon or, in an embodiment designed to create compressive stress channel axis stress in the second region, a material such as silicon germanium having a lattice constant greater than silicon.

In another aspect, a semiconductor fabrication process includes forming a first gate structure overlying a first active region, e.g., an NMOS active region, of a semiconductor on insulator (SOI) wafer, and forming a second gate structure overlying a second active region, e.g., a PMOS active region, of the SOI wafer where the first and second active regions both exhibit biaxial tensile stress. The biaxial tensile stress is then modified by selectively reducing a channel axis stress in the second region. Selectively reducing the channel axis stress in the second region may include an amorphizing implant, preferably performed after forming first, relatively shallow source/drain recesses, that increases free-surface relaxation. Further reduction of the remaining stress may be achieved by forming deeper source/drain recesses after which promotion of silicon migration in the second region includes performing a second anneal in an active ambient. The second anneal may include annealing the SOI wafer in a hydrogen bearing ambient maintained at a temperature in a range of approximately 800 to 1000° C. and a pressure of not more than approximately 40 torrs. After the second anneal, the deep recesses are preferably filled with source/drain structures using a material, e.g., silicon germanium, that differs from a material of the second active region, n-type silicon. Masking the first region may include forming a stress neutral or compressive silicon nitride layer selectively over the first region. The silicon nitride layer may be retained in the final integrated circuit, where it serves as an interlevel dielectric.

Figure 10:
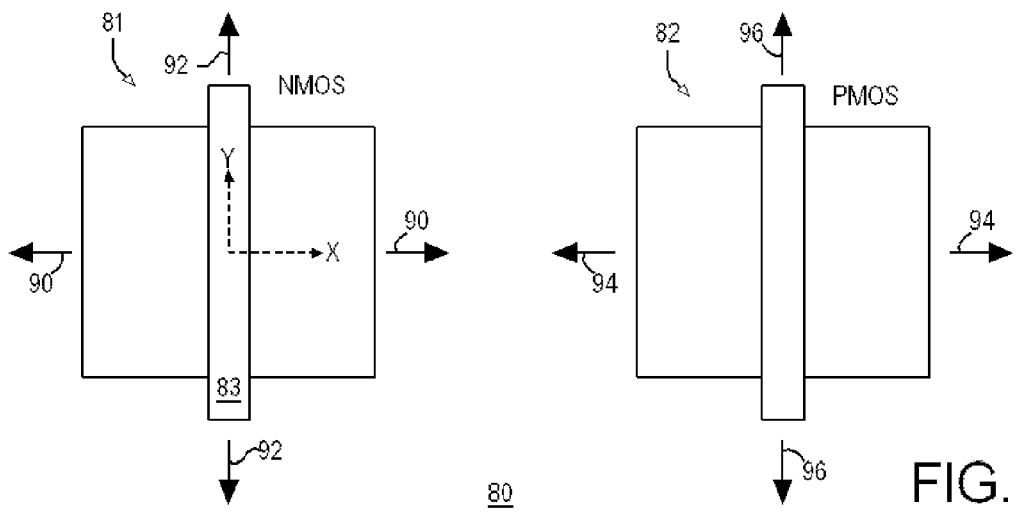
FIG. 10 depicts the inherent stress configurations of NMOS and PMOS devices fabricated on a biaxial-tensile strained substrate.
Figure 11:
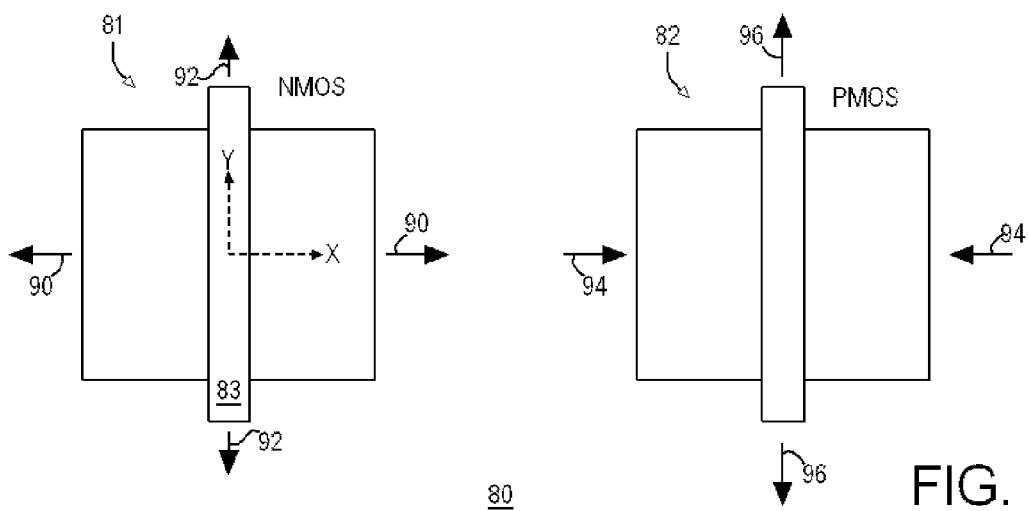
FIG. 11 depicts stress configurations suitable for optimizing carrier mobility in NMOS and PMOS devices.

Turning now to the drawings, and referring initially to FIG. 11, a top view of a small portion of a partially completed, strained-silicon integrated circuit 80 is shown to illustrate stress components suitable for optimized NMOS and PMOS performance. Integrated circuit 80 includes an NMOS transistor 81 and a PMOS transistor 82. Optimized carrier mobility is achieved when the channel of NMOS transistor 81 is under tensile stress along the channel axis (the X axis in FIG. 10) that is perpendicular to transistor gate electrode 83. This stress element is represented in FIG. 10 by stress vectors 90. Similarly, carrier mobility is maximized when the channel of NMOS transistor 81 is under moderate tensile stress along the width axis (the Y axis in FIG. 10) that is collinear with transistor gate electrode 83. This stress element is represented in FIG. 10 by stress vectors 92. Moderate tensile stress along the width axis, represented by the magnitude or length of stress vector 92 relative to stress vectors 90, is preferable to enhance mobility while minimizing threshold voltage shifts for NMOS devices. Optimized carrier mobility for PMOS transistor 82, on the other hand, is achieved when the channel of PMOS transistor 82 is under compressive stress (stress vectors 94) along the channel axis and tensile stress (stress vectors 96) along the width axis.

Unfortunately, as depicted in FIG. 10, starting materials that include conventional biaxially strained semiconductor substrates exhibit tensile stress along the channel axis and the width axis for both types of transistors. In processes that use such starting material, this "inherent" stress is sub-optimal. Specifically, carrier mobility in PMOS devices is degraded by undesired tensile stress, represented by tensile stress vectors 94 in FIG. 10, along the channel axis. In conventional processing, the stress induced shift in NMOS $V_T$ is offset by increased channel doping. Increased channel doping, however, reduces carrier mobility, thereby at least partially negating the reason for which the transistor was strained.

Figure 2:
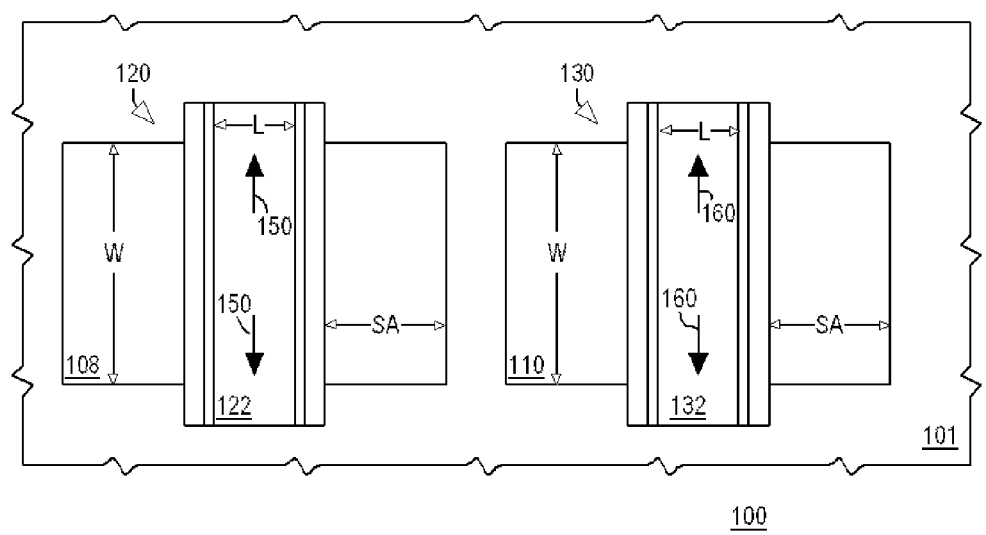
FIG. 2 is a top view of the integrated circuit of FIG. 1.

Referring now to FIG. 1 and FIG. 2, a cross sectional view and top view respectively of a portion of an integrated circuit 100 are described. Integrated circuit 100 includes an NMOS transistor 120 and a PMOS transistor 130 fabricated in a semiconductor wafer and, more specifically, a semiconductor on insulator (SOI) wafer 101. SOI wafer 101 includes a buried oxide (BOX) layer 102 underlying an active layer 104. Active layer 104 includes a p-type semiconductor region referred to herein as NMOS active region 107 and a n-type semiconductor region referred to herein as PMOS active region 109. Active regions 107 and 109 are preferably crystalline silicon regions at the processing stage depicted in FIG. 1. In other embodiments, however, active regions 107 and 109 may be comprised of another semiconductor element or semiconductor compound such as silicon germanium, silicon carbon, gallium arsenide, and so forth. Those skilled in semiconductor fabrication process will recognize that SOI wafer 101 may include a bulk portion (not depicted in FIG. 1), likely made of silicon or another semiconductor, that underlies BOX layer 102.

NMOS transistor 120 includes an NMOS gate structure 121 having a conductive gate electrode 122 overlying a gate dielectric 125, an offset spacer 123 adjacent to sidewalls of gate electrode 122, and an extension spacer 124 adjacent to sidewalls of offset spacer 123. Conductive gate electrode 122 may be a heavily doped (n+) silicon gate electrode, a metal gate electrode, or a combination thereof Gate dielectric 125 is preferably a thermally formed silicon dioxide. Offset spacer 123 is preferably a silicon oxide compound such as a deposited oxide while extension spacer 124 is preferably a silicon nitride spacer.

PMOS transistor 130 includes a PMOS gate structure 131 having a conductive gate electrode 132 overlying a gate dielectric 135, an offset spacer 133 adjacent to sidewalls of gate electrode 132, and an extension spacer 134 adjacent to sidewalls of offset spacer 133. Conductive gate electrode 132 may be a heavily doped (n+) silicon gate electrode, a metal gate electrode, or a combination thereof Gate dielectric 135 is preferably a thermally formed silicon dioxide. Offset spacer 133 is preferably a silicon oxide compound such as a deposited oxide while extension spacer 134 is preferably a silicon nitride spacer.

NMOS transistor 120 and PMOS transistor 130 may include extension implants and/or source/drain implants, which are not shown. In some embodiments, however, extension implants and/or source/drain implants are deferred until after stress engineering processing described below with respect to FIG. 3 through FIG. 9.

Active layer 104 of SOI wafer 101 includes isolation structures 106 between NMOS active region 107 and PMOS active region 109. NMOS active region 107 includes an NMOS channel region 128 while PMOS active region 109 includes a PMOS channel region 138. The boundaries of NMOS channel region 128 and PMOS channel region 138 are determined by the location of NMOS gate structure 121 and PMOS gate structure 131, which overlie NMOS channel region 128 and PMOS channel region 138 respectively. More specifically, NMOS gate structure 121 includes a conductive gate electrode 122 having sidewalls that define the boundaries of NMOS channel region 128. Similarly, PMOS gate structure 131 includes a conductive gate electrode 132 having sidewalls that define the boundaries of PMOS channel region 138. Those familiar with semiconductor fabrication processing will appreciate that source/drain regions 108 and 110 may include lightly doped extension regions and heavily doped source/drain areas that are not explicitly differentiated in this disclosure.

FIG. 1 and FIG. 2 illustrate stress components in active layer 104. In the depicted embodiment, SOI wafer 101 is a biaxial tensile strained SOI wafer in which NMOS active region 107 and PMOS active region 109 both exhibit biaxial tensile stress. The biaxial stress in NMOS region 107 is indicated by the stress vector 152 in FIG. 1, which indicates the tensile stress along an axis or direction referred to herein as the channel axis, and by the stress vector 150 in FIG. 2, which indicates the tensile stress along an axis referred to herein as the width axis. The biaxial stress in PMOS active region 109 is indicated by the channel axis stress vector 162 in FIG. 1 and the width axis stress vector 160 in FIG. 2.

The biaxial tensile stress of SOI wafer 101 is ideally suited for improving the carrier mobility and thus the performance of NMOS transistor 120, but the tensile source/drain stress in PMOS transistor 130 degrades carrier mobility. Optimizing carrier mobility for both types of transistors is achieved as described herein by selective stress modification of the PMOS active region 109.

Figure 3:
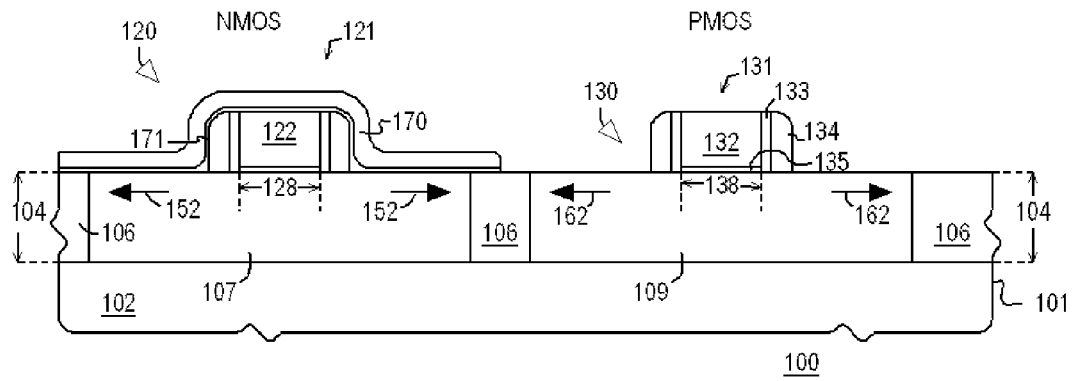
FIG. 3 is a partial cross sectional view depicting processing subsequent to FIG. 1 in which the NMOS transistor is selectively masked with a dielectric layer.

Turning now to FIG. 3, a thin pad oxide layer 171 is deposited overlying SOI wafer 101 and a thick dielectric masking layer 170 is selectively formed overlying the NMOS region 107 and NMOS gate structure 121 of SOI wafer 101. Thin pad oxide layer 171 is preferably a deposited silicon oxide film having a thickness of not more approximately 15 nm. Dielectric masking layer 170 is preferably a silicon nitride layer having a thickness in the range of approximately 30 to 100 nm. In the preferred embodiment, dielectric masking layer 170 is formed as a stress-neutral film or as a tensile film. Although silicon nitride is disclosed as the preferred dielectric for dielectric masking layer 170, other embodiments may use a different dielectric material, for example, silicon oxide and/or silicon oxynitride. As depicted in FIG. 3, the formation of dielectric masking layer 170 does not substantially alter the source/drain stress vector 152 in NMOS active region 107 or the source/drain stress vector 162 in PMOS active region 109.

Figure 4:
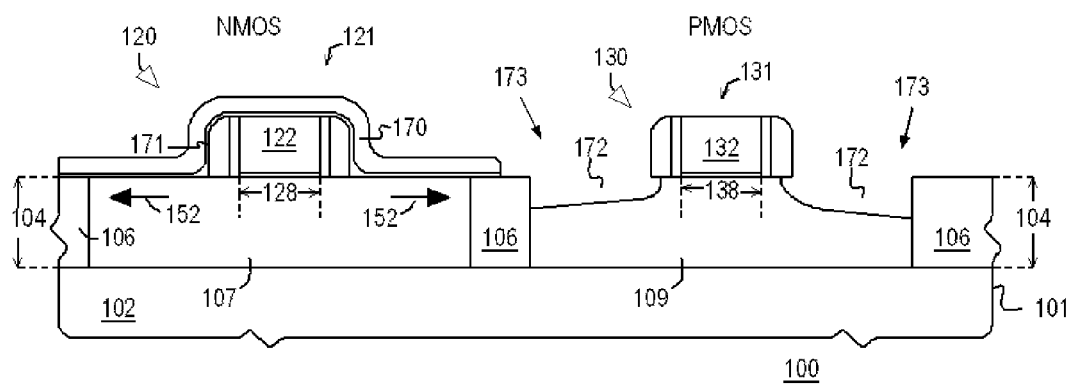
FIG. 4 depicts processing subsequent to FIG. 3 in which shallow recesses are formed in the source/drain regions of the PMOS transistor.

Turning now to FIG. 4, a first active layer etch process 173 is performed to create first, relatively shallow source/drain recesses 172 in PMOS active region 109. The preferred implementation of first active layer etch process 173 is highly selective between the active layer material, e.g., n-doped silicon, and the dielectric materials used for dielectric masking layer 170, e.g., silicon nitride, and isolation structures 106, e.g., silicon oxide. As depicted in FIG. 4, first active layer etch process 173, in addition to being highly selective with respect to dielectric materials in dielectric masking layer 170 and isolation structures 106, is relatively isotropic such that the depth of recess 172 below an upper surface of PMOS active region 109 may approximate the amount of horizontal or lateral etch, which is represented by the amount by which recess 172 undercuts PMOS gate structure 131. Preferably, an active:dielectric selectivity of first active layer etch process 173 is greater than five. First active layer etch process 173 preferably forms recesses 172 having a depth of approximately 15-25 nm.

Figure 5:
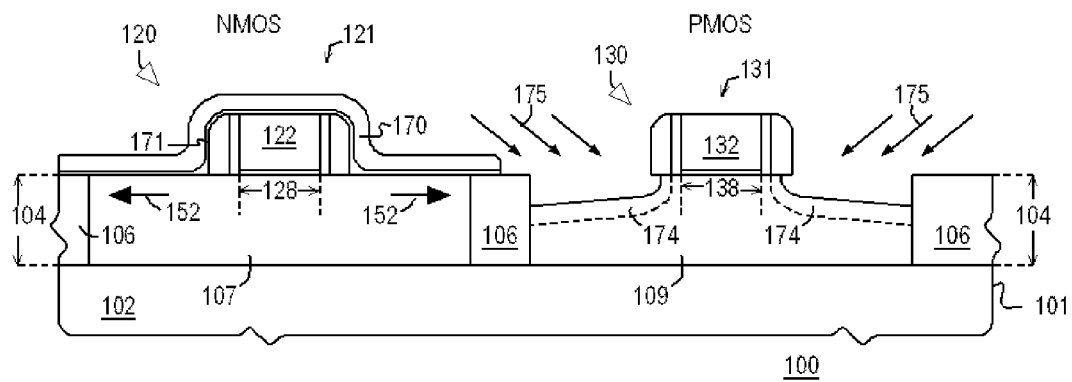
FIG. 5 depicts processing subsequent to FIG. 4 in which angled strain-relieving implants are performed in to amorphize an upper portion of the shallow recessed source/drain regions of the PMOS transistor.

In FIG. 5, an amorphizing implant 175 is performed. Amorphizing implant 175 preferably uses a heavy atom species, e.g. Ge, Xe or Si, an implant angle in a range of approximately 20-40 degrees, an implant energy in a range of approximately 10-20 keV, and an implant dose in a range of approximately $1\times10^{15}$ cm$^{-2}$ to $1\times10^{16}$ cm$^{-2}$ is performed on in PMOS active region 109. In one embodiment, amorphizing implant 175 creates an amorphous layer 174 of silicon, or another semiconductor, having a depth of less than approximately 30 nm.

Figure 6:
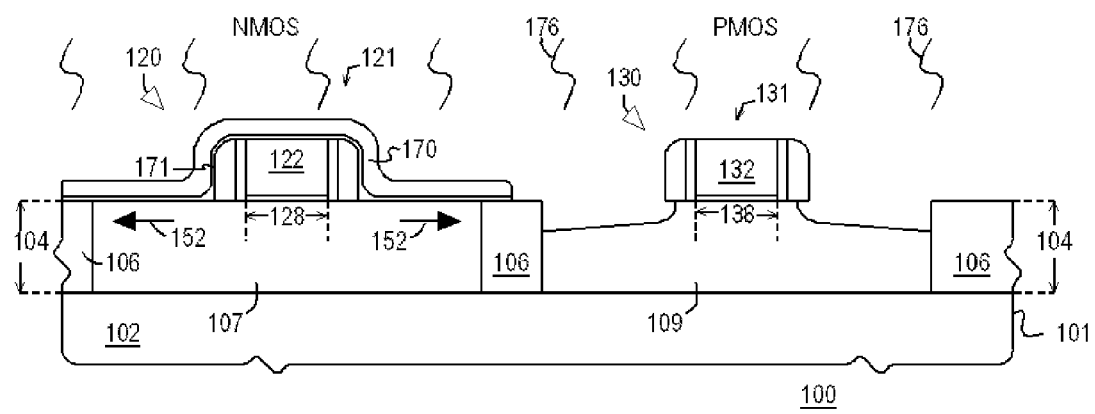
FIG. 6 depicts processing subsequent to FIG. 5 in which the amorphous regions in the shallow recessed source/drain regions of the PMOS transistor are re-crystallized with an anneal.

In FIG. 6, a first anneal 176 is performed in a neutral or inert ambient to re crystallize amorphous layer 174. In one embodiment, first anneal 176 is characterized by a short duration (e.g., 10 to 100 milliseconds) and a peak temperature in a range of approximately 1050-1080 C. First anneal 176 re-crystallizes amorphous layer 174 and reduces the tensile strain in PMOS channel region 138 of PMOS active region 109.

Figure 7:
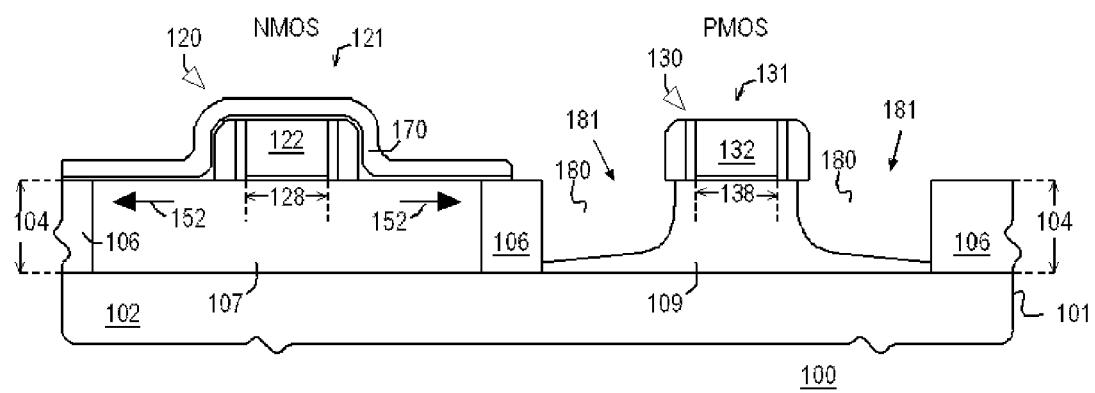
FIG. 7 depicts processing subsequent to FIG. 6 in which the shallow recesses are deepened to form deep recessed source/drain regions of the PMOS transistor.

Turning now to FIG. 7, a second active layer etch process 181 is performed to deepen the source/drain recess 172 to form 180 in PMOS active region 109. The preferred implementation of active layer etch process 181 is highly selective between the active layer material, e.g., n-doped silicon, and the dielectric materials used for dielectric masking layer 170, e.g., silicon nitride, and isolation structures 106, e.g., silicon oxide. As depicted in FIG. 4, active layer etch process 181, in addition to being highly selective with respect to dielectric materials in dielectric masking layer 170 and isolation structures 106, is highly directional meaning that the depth of recess 180 below an upper surface of PMOS active region 109 is substantially greater than the amount of horizontal or lateral etch, which is represented by the amount by which recess 180 undercuts PMOS gate structure 131. Preferably, the depth of source/drain recess 180 is at least five times the amount of lateral undercutting and the active-to-dielectric selectivity of source/drain recess etch 181 is greater than five. As depicted in FIG. 4, active layer recess etch 181 terminates before etching through PMOS active region 109 thereby leaving a portion of PMOS active region 109 covering BOX layer 102. The portion of PMOS active region 109 left behind after active layer etch process 181 facilitates the subsequent recrystallization of source/drain structures as described in greater detail below.

Figure 8:
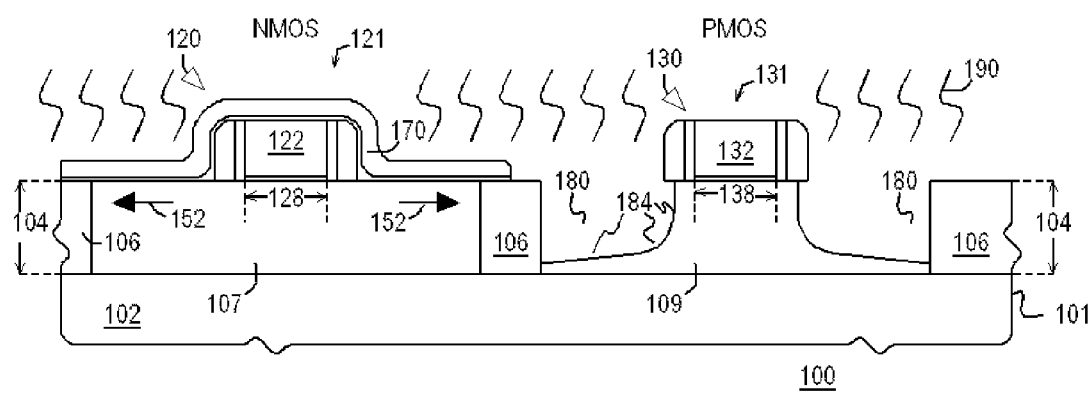
FIG. 8 depicts processing subsequent to FIG. 7 in which a hydrogen anneal is performed.

Turning now to FIG. 8, SOI wafer 101 is annealed by exposing SOI wafer 101 to an annealing ambient 190. Annealing ambient 190 is preferably a hydrogen bearing ambient, e.g., $H_2$ or $GeH_2$, maintained at a temperature in a range of approximately 800 to 1000° C. In one embodiment, annealing ambient 190 is created in an low pressure chemical vapor deposition (LPCVD) chamber at a pressure of 40 torr (53.3 millibars) or less with a composition of at least 90% hydrogen and 10% ambient (e.g., nitrogen). A duration of the anneal process is implementation specific, but may be in the range of approximately 30 to 300 seconds.

Exposing SOI wafer 101 to hydrogen annealing ambient 190 promotes self migration of silicon proximal to the surface 184 of recess 180. Silicon self migration results in a reduction of tensile stress in PMOS active region 109. More specifically, the silicon migration promoted by hydrogen anneal proceeds preferentially along the channel axis resulting in a uniaxial stress reduction. While the channel axis stress is reduced, the width axis stress is relatively unaltered. The preferential reduction of channel axis tensile stress in the PMOS active region 109 beneficially improves carrier mobility thereby resulting in improved PMOS performance (e.g., increased PMOS saturated drain current PMOS $I_{DS}$).

Figure 9:
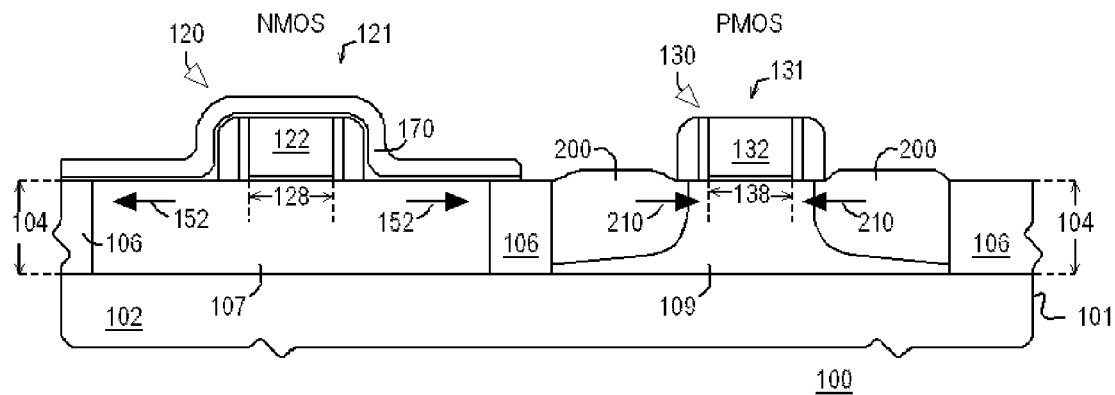
FIG. 9 depicts processing subsequent to FIG. 8 in which PMOS source/drain structures are formed to fill the source/drain recesses of FIG. 8.

Turning now to FIG. 9, source/drain structures 200 are formed to fill the recesses 180 in PMOS transistor 130. In one embodiment, formation of source/drain structures 200 is by epitaxial growth. Source/drain structures 200 may be of silicon or another semiconductor element or compound. In one embodiment, source/drain structures 200 have a lattice constant that is greater than the lattice constant of the material in PMOS active region 109. In embodiments where PMOS active region 109 is silicon, source/drain structures 200 may be, e.g., silicon germanium. In such embodiments, the formation of source/drain structures 200 results in the creation of a compressive stress component 210 along the channel axis in PMOS channel region 138. Referring back to FIG. 11, the stress configuration of integrated circuit 100 as depicted in FIG. 9 is the preferred stress configuration for simultaneous carrier mobility optimization of NMOS and PMOS transistors.

Following the formation of source/drain structures 200, PMOS source/drain implants may be performed. In one embodiment, dielectric masking layer 170 is used as a mask during the PMOS source/drain implant. In other embodiments, dielectric masking layer 170 and the underlying pad oxide layer are removed and a conventional photoresist mask covering NMOS transistor 120 is used during the source/drain implant. In some embodiments, the NMOS source/drain implant is performed after the formation of source/drain structures 200, either before or after the PMOS source/drain implants. In some embodiments, NMOS source/drain implant is performed prior to the formation of dielectric masking layer 170 and dielectric masking layer 170 serves in the final integrated circuit as a first interlevel dielectric layer (ILD) over NMOS transistors. After completion of source/drain implant processing, integrated circuit 100 is completed by conventional back end processing (not depicted) in which one or more levels of interconnects and ILD's are formed.

In the foregoing specification, the invention has been described with reference to specific embodiments. However, one of ordinary skill in the art appreciates that various modifications and changes can be made without departing from the scope of the present invention as set forth in the claims below. For example, although the illustrated embodiment is described with respect to planar, single gate transistors, other embodiments may employ programmable transistors having floating gates and control gates. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A fabrication process for forming a semiconductor integrated circuit, comprising:
   forming a first gate structure overlying a first active region of a semiconductor on insulator (SOI) wafer;
   forming a second gate structure overlying a second active region of the SOI wafer, wherein the first and second active regions exhibit biaxial tensile stress, and wherein the first active region comprises an NMOS region and the second active region comprises a PMOS region;
   forming a mask over the first active region and the second active region;
   patterning the mask to cover the first active region and expose the SOI wafer in the second active region;
   forming recesses in source/drain regions of the second active region after patterning the mask, wherein forming recesses in source/drain regions includes:
      creating shallow recesses with a first active layer etch process;
      performing an amorphizing implant to create an amorphous layer below a surface of the shallow recesses after creating the shallow recesses;
      recrystallizing the amorphous layer with a neutral ambient anneal; and
   performing a second active layer etch process to deepen the relatively shallow recesses after recrystallizing the amorphous layer to complete a creation of the source/drain recesses; and
   selectively reducing a channel axis stress in the second active region by promoting migration of silicon in the second active region.

2. The process of claim 1, wherein selectively reducing the channel axis stress in the second active region comprises:
   annealing the SOI wafer in a migration promoting ambient after forming the recesses in the source/drain regions of the second active region.

3. The process of claim 2, wherein annealing the SOI wafer comprises annealing the SOI wafer in a hydrogen bearing ambient maintained at a temperature in a range of approximately 800 to 1000° C. and a pressure of not more than 40 torrs.

4. The process of claim 2, further comprising, after said annealing, filling the recesses with source/drain structures, wherein a material of the source/drain structures differs from a material of the second active region.

5. The process of claim 4, wherein the second active region comprises silicon and the source/drain structures comprise silicon germanium.

6. The process of claim 2, wherein masking the first region comprises forming a compressive silicon nitride layer selectively over the first region, wherein the compressive silicon nitride layer serves as an interlevel dielectric in a semiconductor integrated circuit.

7. The process of claim 1, wherein an implant species of the amorphizing implant is selected from the group consisting of Ge, Xe, and Si, an implant angle is in a range of approximately 20 to 40 degrees, and an implant energy is in a range of approximately 10 to 20 keV and further wherein a duration of the neutral ambient anneal is in the range of approximately 10 to 100 milliseconds and a peak temperature is in a range of approximately 1050 to 1080 C.

8. An integrated circuit fabricated according to the fabrication process of claim 1.

* * * * *